United States Patent [19]

Vanderspool, II

[11] Patent Number: 4,633,197

[45] Date of Patent: Dec. 30, 1986

[54] SINGLE RESONANT TANK MODULATED OSCILLATOR

[75] Inventor: Jan P. Vanderspool, II, Schaumburg, Ill.

[73] Assignee: Motorola, Inc., Schaumburg, Ill.

[21] Appl. No.: 717,427

[22] Filed: Mar. 29, 1985

[51] Int. Cl.[4] .......................... H03C 3/08; H03C 3/09
[52] U.S. Cl. ................................ 332/16 T; 331/36 C; 331/117 D; 331/117 V; 332/18; 332/19; 332/30 V
[58] Field of Search .................. 332/16 T, 18, 30 V, 332/19; 331/36 C, 117 D, 177 V; 455/42–44, 110, 113

[56] References Cited

U.S. PATENT DOCUMENTS

| | | | |
|---|---|---|---|
| 3,204,198 | 8/1965 | Bachnik | 331/101 |
| 3,353,117 | 11/1967 | Renkowitz | 331/177 V |
| 3,400,338 | 9/1968 | Ishman | 332/30 V |
| 3,479,615 | 11/1969 | Garver | 332/30 V |
| 3,512,105 | 5/1970 | Lance, Jr. et al. | 331/96 |
| 3,528,032 | 9/1970 | Tahmisian, Jr. et al. | 331/116 R |
| 3,581,240 | 5/1971 | Enderby | 332/26 |
| 3,601,723 | 8/1971 | Johnson | 334/15 |
| 3,697,890 | 10/1972 | Healey, III et al. | 331/116 R |
| 3,747,032 | 7/1973 | Hall et al. | 333/82 B |
| 3,916,344 | 10/1975 | Enderby | 331/116 R |
| 3,982,211 | 9/1976 | Endersz | 331/96 X |
| 3,997,848 | 12/1976 | Rippy | 329/122 |
| 4,003,004 | 1/1977 | Fletcher et al. | 332/30 V |
| 4,088,968 | 5/1978 | Pradal et al. | 332/26 |
| 4,117,422 | 9/1978 | Hunt | 332/18 |
| 4,140,981 | 2/1979 | Bergman | 332/18 |
| 4,156,211 | 5/1979 | Buswell et al. | 331/117 D |
| 4,189,690 | 2/1980 | Bock et al. | 332/30 V |
| 4,270,098 | 5/1981 | Bowman | 331/96 |
| 4,375,621 | 3/1983 | Schneiter et al. | 332/16 T |
| 4,378,534 | 3/1983 | Goedken et al. | 332/18 |
| 4,458,215 | 7/1984 | Huang et al. | 331/117 D |
| 4,554,517 | 11/1985 | Parniere et al. | 332/18 |

OTHER PUBLICATIONS

Makimoto et al, "800 MHz V.C.O. For Land Mobile Radio Synthesizers", Electronics Letters, vol. 15, No. 5, Jul. 19, 1979, pp. 460–461.
K. Johnson, Microwave Varactor Tuned Transistor Oscillator Design, IEEE Transactions on Microwave Theory and Techniques, vol. MTT 14, No. 11, Nov. 1966, pp. 564–572.
Tomoyoshi Yamashita and Masataka Okubo, "Frequency Modulator Using Solid Device Oscillator and Varactor", *Fujitsu Scientific & Technical Journal*, vol 7, No. 3, pp. 1–19, Sep. 1971.
G. Endersz, "Linearity Improvement of Microwave FM Oscillators by Harmonic Tuning," IEEE Transactions on Microwave Theory and Techniques, vol. MTT-23, No. 4, pp. 360–367, Apr. 1975.
William H. Lockyear, "Linearize VCOs by Reactance Compensation," *Microwave Journal*, pp. 60–62, 64, 68, Feb. 1980.
Ernesto Marazzi & Vittorio Rizzoli, "The Design of Linearizing Networks for High Power Varactor-Tuned Frequency Modulator", *IEEE Transactions on Microwave Theory and Techniques*, vol. MTT-28, No. 7, pp. 767–773, Jul. 1980.
Walter Niblack, "Silicon Frequency-Linear Tuning Varactors", Preliminary Application Note AN-103, Frequency Sources, Inc., Chelmsford, Massachusetts, Aug. 30, 1983.
Farinon (Division of Harris, Inc.), Service Manual for FAS-2000 Microwave Radio, Schematic SD-103433, 1983.
Androski, Lentz and Salvage, *4A FM Transmitter and Receiver*, The Bell System Technical Journal, vol. 50, No. 7, Sep. 1971, pp. 2249–2269.

*Primary Examiner*—Siegfried H. Grimm
*Attorney, Agent, or Firm*—Raymond A. Jenski; Donald B. Southard

[57] ABSTRACT

A modulatable oscillator for radio frequencies is disclosed in which the single resonant tank includes a tightly coupled varactor diode for wideband modulation and frequency control. Nonlinearities introduced by the varactor diode are compensated by predistortion of the modulated signal yielding a predetermined modulation characteristic which is maintained over temperature.

9 Claims, 10 Drawing Figures

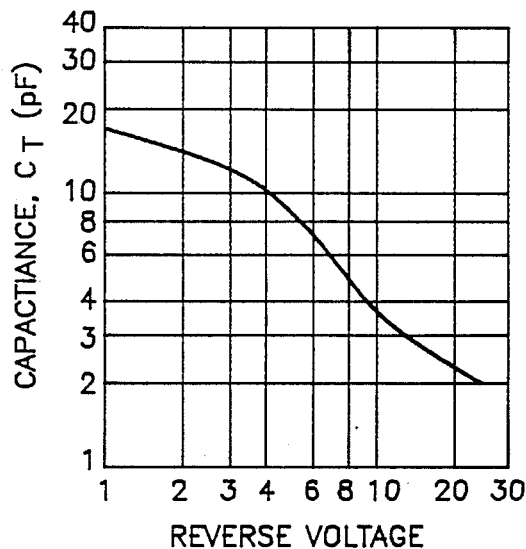
Fig. 4
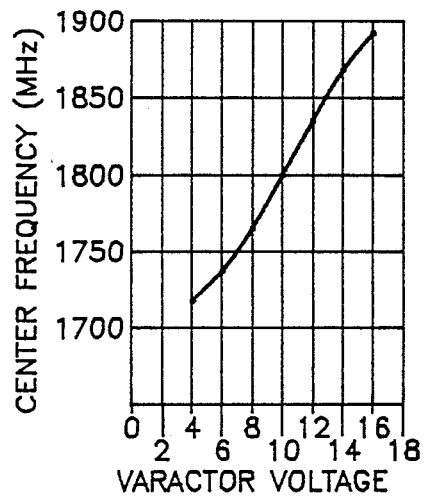
Fig. 5
Fig. 6
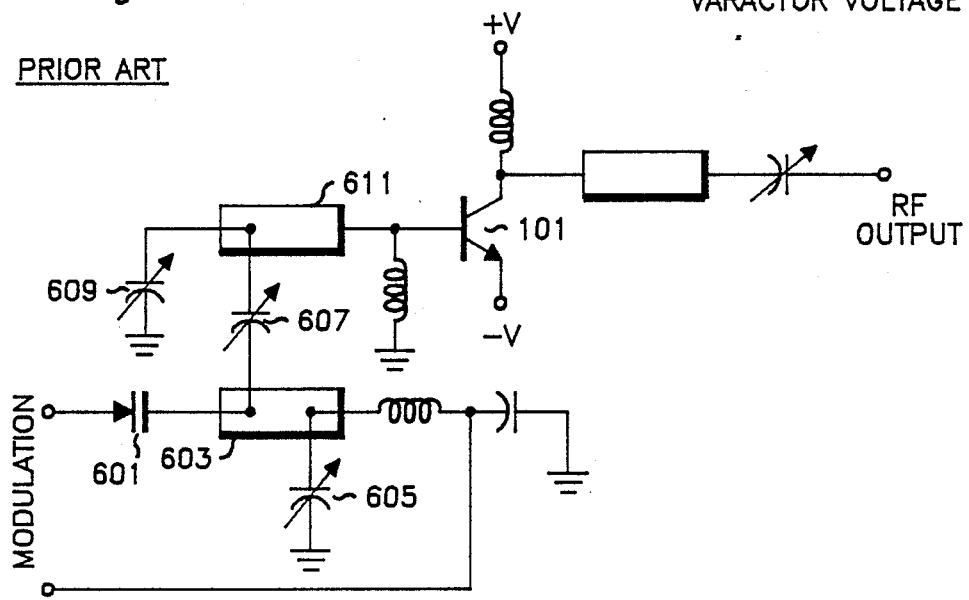
PRIOR ART

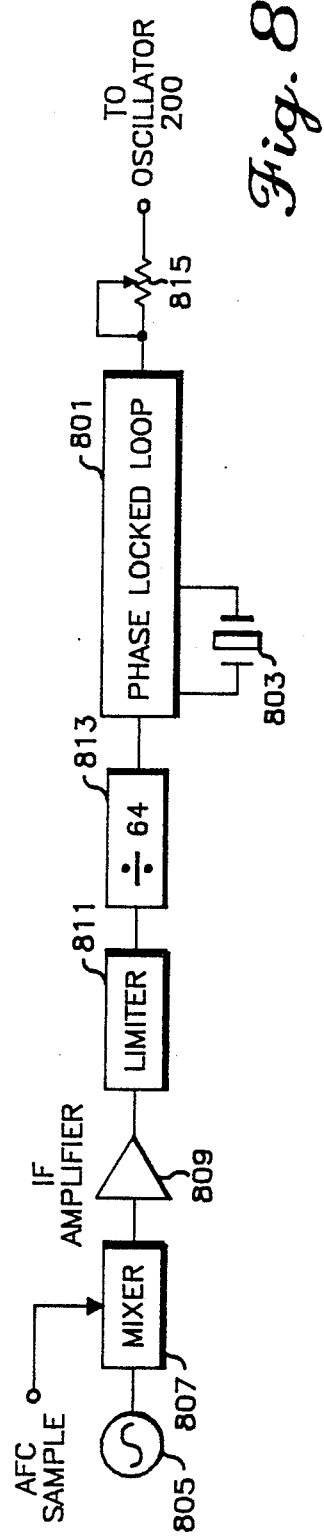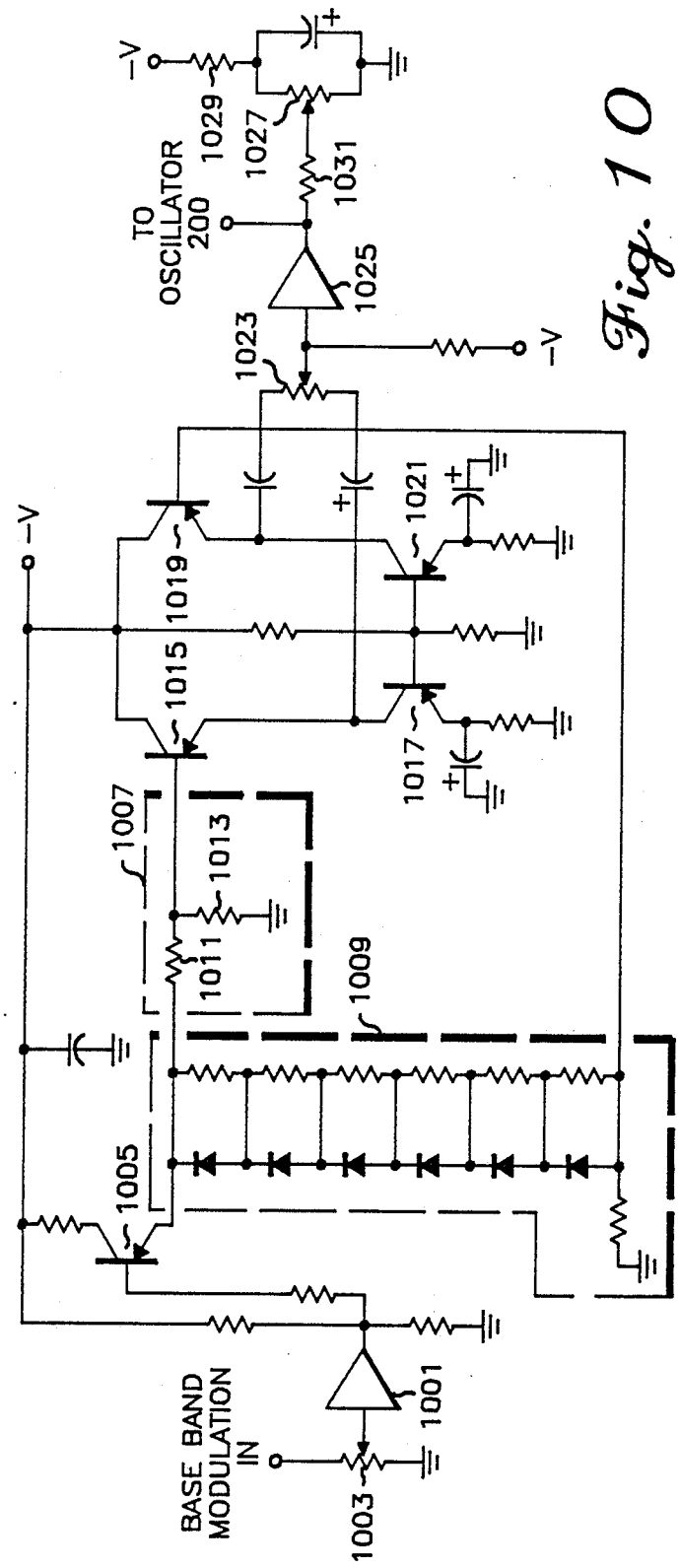

SINGLE RESONANT TANK MODULATED OSCILLATOR

BACKGROUND OF THE INVENTION

The present invention generally relates to modulated oscillators and more specifically relates to an angle modulatable radio frequency oscillator in which the element or elements impressing the modulation upon the radio frequency energy are a significant factor in the determination of the oscillator center frequency. Such elements, because of their close coupling to the oscillator, may substantially determine the temperature induced changes in oscillator center frequency and may therefore be employed in the frequency stabilization of the oscillator center frequency without detriment to the linearity of modulation.

The radio frequency (RF) generator in most radio transmitters is an electronic circuit which, with appropriate feedback, oscillates at a preselected frequency. Information may be impressed upon this preselected frequency, or center frequency, in several ways. One common way is to angle modulate the oscillator center frequency thereby frequency or phase modulating information on the carrier of the radio frequency.

Low frequency RF oscillators, which have their center frequency determined by a piezoelectric device, have been shown capable of being angled modulated with a voltage variable capacitor diode, commonly known as a varactor. One such oscillator is shown in U.S. Pat. No. 3,528,032, assigned to the assignee of the present invention. There, sensitivity of the modulation element to a modulation signal is essentially determined by the amount of reactance change which can be achieved by the varactor. Because of the large reactance values found in a crystal oscillator, the amount of modulation which can be achieved by a varactor diode is small, due to its relatively small reactance value. Means for controlling the amount of sensitivity has been described in U.S. Pat. Nos. 3,916,344 and 4,378,534, each assigned to the assignee of the present invention.

At microwave frequencies, generally considered to be frequencies above 1,000 MHz, it is common to oscillate at relative high power levels by including an active device such as a Gunn diode or transistor in a feedback network comprised of a high Q electronically resonant structure which determines the frequency of oscillation by its electronic dimensions. Oscillators of this type are described in U.S. Pat. No. 4,270,098 and U.S. Pat. No. 4,542,352, Yester, Jr. et al. each assigned to the assignee of the present invention.

The transmitters employed in the radio communications services at microwave frequencies are generally required to modulate the center frequency with a wide bandwidth modulating signal. This modulating signal may consist of a large number of independent narrow band channels, such as an audio channel of 4 KHz, multiplexed together into a baseband signal of a bandwidth of 2 MHz or more in bandwidth. Methods employed previously to modulate the oscillator center frequency have employed a separate resonant network including a varactor which is loosely coupled to the main frequency determining network, or tank, of the oscillator. (See U.S. Pat. No. 4,542,352, Yester, Jr., et al., and U.S. Pat. Nos. 4,270,098; 3,747,032; and 3,601,723). These multiple resonant tank approaches are typically most applicable to frequency modulated applications where octave or more of operational bandwidth is not expected. Previous realizations of multiple resonant tank approaches have generally selected one of the following methods. First, two resonant tanks are coupled via an impedance inverter to realize modulation with a linear change in frequency with applied modulation voltage. Second, a resonator containing a varactor is coupled to the frequency determining tank via a probe having a unique physical configuration (U.S. Pat. Nos. 3,747,032 and 4,375,621). Third, a resonant network is tuned to a harmonic of the center frequency reportedly effecting a broader frequency versus tuning curve (U.S. Pat. No. 3,982,211). And fourth, employing either a varactor tuned shunt circuit added to the resonant active circuit or a paralleled fixed-tuned resonator circuit added to a varactor tuned circuit.

Analysis of dual tank impedance inverter coupled circuits shows that an oscillator employing such a circuit for introducing modulation has a linear frequency vs. voltage characteristic when the varactor parasitic shunt capacitance is resonant with the inductance of coupling mechanism and the varactor normalized capacitance tuning curve is indicative of a normalized capacitance vs. normalized applied voltage relationship having a "gamma" equal to 1. The capacitance to voltage relationship may be expressed as:

$$C = C_o/(1+V/\phi)^\gamma$$

where:
C = varactor junction capacitance
V = applied voltage
$\phi$ = semiconductor contact potential
$C_o, \gamma$ = constants
and normalized to:

$$C' = (V')^{-\gamma}$$

where:
$C' = C/C_o$
$V' = 1 + V/\phi$

Thus, the dual tank impedance inverter coupled circuit requires the approximation of a perfectly linear circuit by employing a varactor having a normalized capacitance equal to an inverse normalized applied voltage raised to a constant power (gamma) which is equal to 1 (gamma=1). As a practical matter, gamma is a function of applied voltage and somewhat difficult to control and maintain. (See Androski, Lentz, and Salvage, 4A FM Transmitter and Receiver, Bell System Technical Journal, Vol. 50 No. 7, September 1971, pg. 2255–58).

Linearity of modulation for complex wide bandwidth modulating signals is important for prevention of intermodulation distortion in the transmitted signal. In a microwave radio system transmitting a large number of frequency division multiplex (FDM) channels, for example 600 channels, excessive intermodulation would result in cross talk and excessive noise between the FDM channels. Ideally, for no intermodulation distortion in a frequency modulated oscillator, the frequency versus modulation voltage curve should be perfectly linear; that is, the second derivative, $d^2F/dV^2$, and all higher order derivatives should be equal to zero. However, since second order differential-gain slope variations ($d^2F/dV^2$=non zero constant) occur in other parts of the radio transmission and reception system, a perfect straight-line frequency vs. modulation tuning curve at the transmitter modulated oscillator may not be desired. Thus, it may be desirable to have a variable amount of second derivative in the frequency versus modulation voltage curve in the transmitter modulated oscillator with a "linearity" adjustment to effect an adjustment to overall zero and non-zero values of second derivative. Higher order derivatives of the frequency versus modulation voltage curve are highly undesirable and are conventionally minimized by varying the coupling of the modulation tank to the frequency determining tank of the modulating oscillator until the amount of higher order derivatives are minimized for a particular center frequency.

If the linearity adjustment, selecting a compensating second derivative value (or zero) and minimizing higher order derivatives, can be made independent of the modulation voltage and bias point of the varactor diode, the same varactor diode used for modulation may be employed to control the center frequency of the modulated oscillator. Such a control would enable the oscillator center frequency to be maintained at a preselected frequency despite changes in the resonant point of the frequency determining elements over temperature. However, tight coupling of the varactor to the frequency determining elements of the oscillator feedback circuitry to accomplish these features has been contraindicated by several authorities. Degradation of oscillator noise performance and temperature stability performance due to the limited Q of the varactor have been projected penalties.

SUMMARY OF THE INVENTION

Therefore, one object of the present invention is to enable a modulated oscillator to respond to an applied modulation voltage with a linearized predetermined change in oscillator frequency.

Another object of the present invention is to reduce the interaction between adjustment of modulation sensitivity and adjustment of linearity.

A further object of present invention is to tightly couple the modulation varactor to the frequency determining network of the oscillator such that the frequency drift of the oscillator frequency may be reduced to a desirable amount by compensating the varactor diode drift.

Accordingly, these and other objects are realized in the present invention. Here, a frequency or phase modulated oscillator employs an active device in a feedback circuit such that oscillation occurs. Modulation is impressed on the oscillator center frequency by a voltage variable capacitive element which is a significant part of the capacitive impedance component of the oscillator feedback circuit. This voltage variable capacitive element produces a nonlinear change about the oscillator center frequency with an applied modulation voltage. A modulation predistorter network is coupled to the voltage variable capacitive element to compensate the nonlinear change about the oscillator center frequency and produces a predetermined change with the applied modulation voltage. Additionally, a frequency controlling network is coupled to the voltage variable capacitive element to maintain the oscillator center frequency essentially constant over temperature.

BRIEF DESCRIPTION OF THE DRAWINGS

FIG. 4 is a graph of the applied voltage versus capacitance characteristic of a less expensive non-constant-gamma hyperabrupt varactor.

FIG. 5 is a graph of the applied voltage versus oscillator center frequency of a modulated oscillator using a non-constant-gamma hyperabrupt varactor for introducing frequency modulation onto the oscillator center frequency.

FIG. 6 is a schematic diagram of a conventional planar modulated oscillator employing two tuned tanks to establish the oscillator center frequency and to introduce modulation.

FIG. 8 is a schematic diagram of an AFC circuit which may be employed in the present invention.

FIG. 10 is a schematic diagram of a predistorter circuit which may be employed in the present invention.

DESCRIPTION OF THE PREFERRED EMBODIMENT

The invention disclosed herein preferably is a 2 GHz frequency modulated oscillator suitable for use in a transmitter of a medium density, line-of-site microwave radio capable of carrying approximately 600 frequency division multiplex (FDM) 4 KHz bandwidth voice channels in a baseband of over 2 MHz. The carrier linear modulation bandwidth for such a frequency modulated transmitter is approximately 6 MHz. Although a particular embodiment is described for the above mentioned radio, the present invention is useful in any modulatable oscillator which must be modulated over a wide modulation bandwidth.

Figure 1:
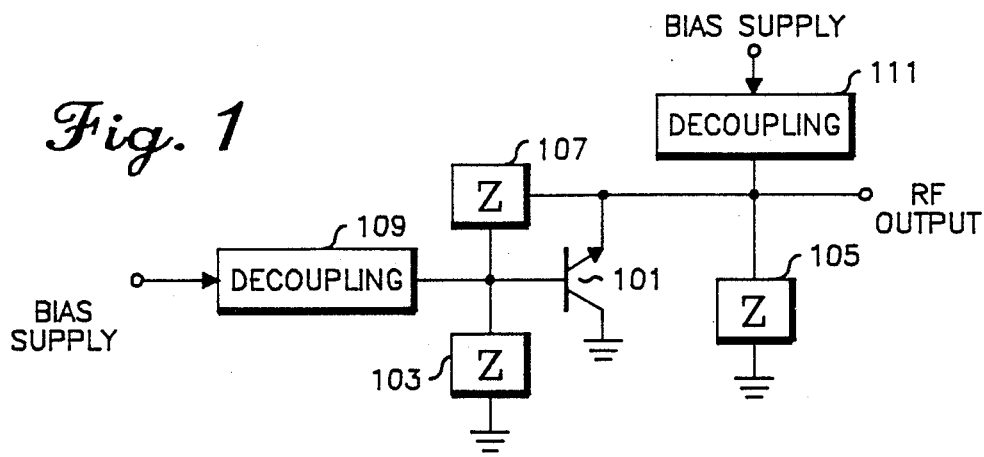
FIG. 1 is a block diagram of a negative resistance oscillator which may employ the present invention.

The topology of the oscillator employed in the present invention is shown in FIG. 1. Here, a negative resistance oscillator is shown employing a grounded collector NPN bipolar transistor 101 as the active element in the circuit. The frequency of oscillation of the network is determined primarily by input impedance 103 and oscillation is sustained by output impedance 105 and feedback impedance 107. Power is introduced to the active device 101 through the decoupling networks 109 at the base and 111 at the emitter of transistor 101. Alternative approaches, such as frequency selective feedback oscillators, may also be used.

The preferred embodiment is realized on a planar microstrip substrate which allows the impedances 103, 105, and 107 to be easily realized using physical electrical components in series with predetermined lengths of microstrip transmission lines with predetermined characteristic impedances. Output power may be tapped off of any of the three oscillator transistor 101 leads or coupling from any of three oscillator impedances 103, 105, or 107; by employing a common collector figuration, the preferred embodiment dictates the output tap to be the emitter as shown in FIG. 1.

Figure 2:
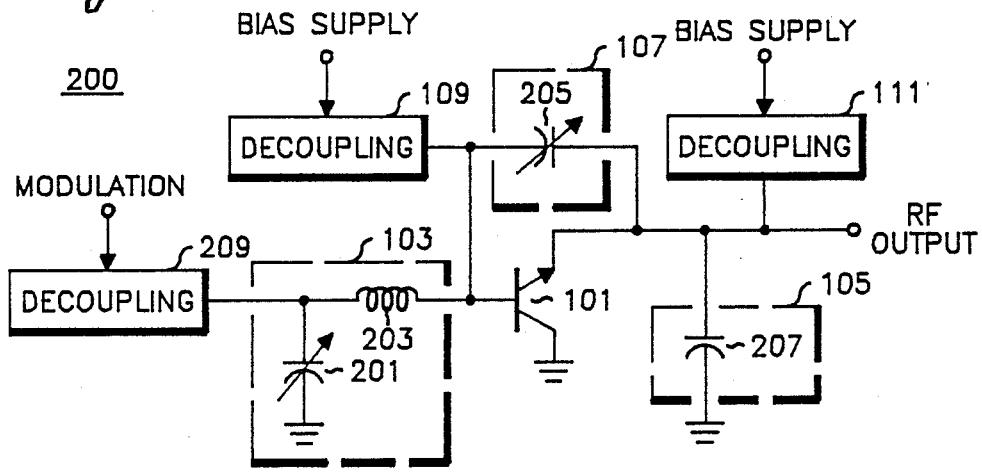
FIG. 2 further defines the elements of FIG. 1.

Specifically, the impedances used in the preferred embodiment of a modulated oscillator 200 are: A tuned circuit (or tank) comprised of a variable capacitive impedance 201 and inductive impedance 203 for input impedance 103 in FIG. 2. Feedback impedance 107 is a variable capacitance 205. Output impedance 105 consists of the stray capacitance 207 which is readily controlled by the microstrip layout. It becomes readily apparent that the modulation may be introduced onto a center frequency of the oscillator (the frequency at which the oscillator and its surrounding impedances are tuned) by varying the value of capacitor 201. This frequency modulation is accomplished by applying the modulation through the decoupling network 209 to a voltage variable capacitive element such as a varactor.

It is general dogma in the design of wide modulation bandwidth oscillators that the varactor should not form any significant part of the frequency determining capacitive reactance because the varactor presence in the tank results in unmanageable nonlinearities of modulation, temperature instability, and degraded noise performance. (See Marazzi and Rizzoli, *The Design of Linearizing Networks for High-Power Varactor-Tuned Frequency Modulators*, IEEE Transactions on Microwave Theory and Techniques, Volume MTT-28, no. 7, July, 1980). The present invention proves that these problems may be overcome with the novel elements described hereinafter.

Figure 3:
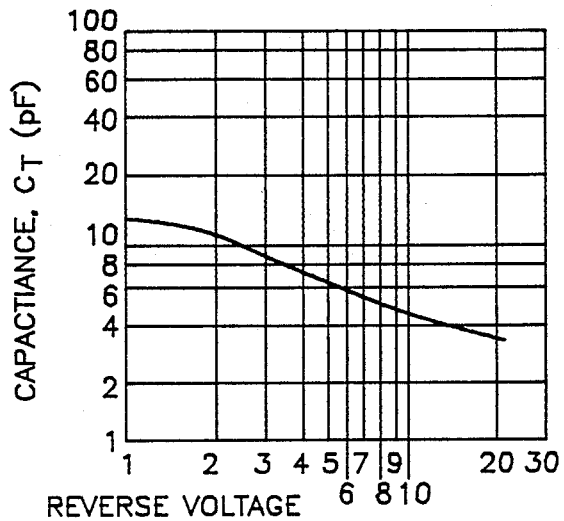
FIG. 3 is a graph of the applied voltage versus capacitance characteristic of a constant-gamma hyperabrupt varactor.

Linearity of modulation is the most significant of the problems identified. As described previously, a defect in modulation which results in a change of oscillator frequency which is not linearly related to (or does not have a system compensating a second derivative equal to constant) a change in modulator voltage causes information contained in one voice channel to be coupled into another voice channel or noise in one channel to be coupled into a second channel in an effect known as intermodulation distortion. (In the following description, a linear modulated oscillator response implies a second derivative of the frequency versus modulation voltage response equal to zero or to a constant which compensates defects in the rest of the radio and transmission path such that the modulation input to modulation detection channel is linear). Major contributors to nonlinearities of modulation are the modulator varactor diode and undesired resonances of the oscillator circuitry at both the fundamental center frequency and harmonicly related frequencies. Typically, varactor diodes are specially selected for a contant gamma equal to 1. The performance curve for one such diode, a MA-46557 available from M/A-COM Inc., is shown in FIG. 3. The fabrication and selection process for the specified linear performance adds substantially to the cost of the varactor making it a very expensive component. Less expensive varactor diodes have a gamma not equal to 1 as shown in FIG. 4 for a DKV-6533C varactor diode available from Alpha Industries which is one of many which may be selected. The varactor diode of FIG. 4 costs from 1/10th to 1/100th of that of the diode of FIG. 3 making it an attractive choice for oscillator designers.

The varactor of FIG. 4, when implemented in the oscillator circuit of the present invention, yields an oscillator center frequency versus applied varactor voltage curve such as that shown in FIG. 5. It can be seen that the response over the entire operational band of oscillator center frequencies is decidedly nonlinear. The curve over this wide frequency range exhibits higher order derivatives in that the curve shape changes from concave upward to concave downward as the frequency increases. Over the modulation bandwidth of 6 MHz, however, the curve generally remains concave upward or concave downward as long as the point of inflection is avoided.

In previous oscillator implementations, concavity was to be avoided. Oscillator designers typically prefer to decouple the varactor diode from the frequency determining tank of the oscillator and use a linear varactor diode to achieve a linear frequency versus applied modulation voltage characteristic in the oscillator. Imperfections in the frequency versus modulation voltage characteristic, which are a manifestation of the presence of higher order derivative terms, are conventionally compensated by adjusting the coupling between the varactor network and the oscillator tank. In the present invention due to the high sensitivity of the tightly coupled varactor at an operating point where the second-order dominates, the higher order terms are negligible.

One of a possible many circuits is shown in FIG. 6. Modulation is applied to varactor 601 which forms part of a secondary resonant circuit additionally comprising transmission line 603 and reactance 605. This second tank is coupled by variable capacitor 607 to the primary resonant tank comprising capacitors 609 and transmission line 611. The applied modulation changes the resonant frequency of the secondary resonant circuit which is coupled to the primary tank as a change in reactance thereby producing a frequency modulation of the oscillator center frequency. Multiple resonant tank approaches such as this are generally most applicable to relatively narrow band frequency modulated applications rather than octave or more bandwidth frequency-agile local oscillators. Multiple resonant tank approaches are clearly more complex than the simple one resonant tank of the present invention.

Figure 7:
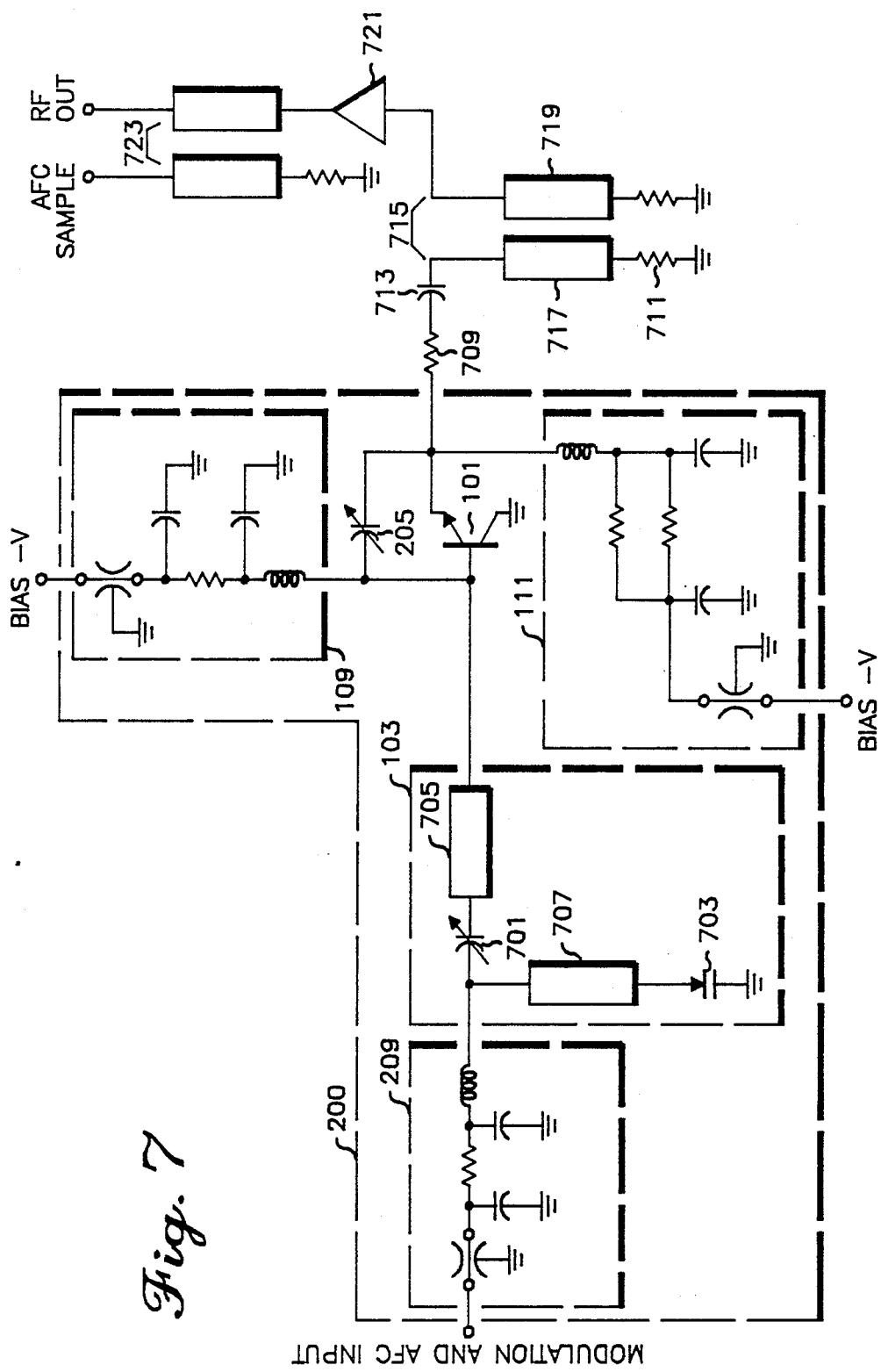
FIG. 7 is a schematic diagram of a modulated oscillator employing the present invention.

The preferred embodiment employing the present invention is shown in FIG. 7. Here, modulated oscillator 200 is implemented on a microstrip substrate. This implementation provides small size, controlled geommetry of line widths and transmission line impedance, and temperature stability. The oscillator is preferably tunable from 1680 MHz to 2010 MHz using the trimmer capacitor 701, which is part of the capacitive reactance of oscillator input impedance 103. The varactor diode 703 is used, as described earlier for frequency modulating the carrier frequency of the oscillator. It has a modulation sensitivity of approximately 11 to 25 MHz per volt and, in the preferred embodiment, the frequency vs. voltage characteristic of the varactor 703 is concave downward where the modulation voltage swings from minus 12 to minus 18 volts. Selection of modulation voltage is a coarse adjustment to the second derivative of the characteristic. In the preferred embodiment trimmer capacitor 701 adjusts the frequency of oscillation with negligible impact on the second derivative value. The minus 12 to minus 18 volt modulation voltage swing preferably causes a frequency change equal to approximately 45% of the modulated oscillator coarse frequency tunable range with negligible impact on modulation sensitivity.

The microstrip transmission lines 705 and 707 provide the inductance component of the input impedance 103 and in the preferred embodiment are transmission lines less than an eighth wavelength long and having a characteristic impedance of 50 ohms. Transmission lines of this nature satisfy the stability criteria above the second harmonic of the center frequency of the oscillator, thereby providing protection against higher harmonic resonances which may cause modulation nonlinearities. In the preferred embodiment, trimmer capacitor 701 was selected to have a capacitor tuning range of from 0.8 to 8 picofarads, the varactor diode 703 was chosen to have a nominal capacitance of 10 picofarads at 4 volts (which is realized by a DKV 6533 diode manufactured by Alpha Industries or an MMBV 105G diode available from Motorola Inc.), the active device 101 was chosen to be a NEX 230187 bipolar transistor available from NEC Inc. Although a particular frequency range and particular component types and values have been indicated herein, the invention need not be so limited. Competent individuals of ordinary skill in the art may choose and select such components as necessitated by their particular design needs without departing from the spirit of the disclosed invention.

The output of modulated oscillator 200 is coupled through a load resistor 709, which provides, in conjunction with output load resistor 711, a proper total load resistance to the emitter transistor 101, thereby satisfying oscillation criteria and providing isolation from changes in output impedance. A DC blocking capacitor 713 couples the oscillator energy to a 20 dB attenuator 715 consisting of 2 parallel transmission lines 717, 719 appropriately separated to provide the desired attenuation while maintaining matched transmission line characteristics. The oscillator energy may be further amplified by a conventional radio frequency (RF) amplifier 721 comprised of one or more active devices in well known amplifier configurations. The output of RF amplifier 721 is applied to a coupler 723, which may be a parallel transmission line attenuator such as that described before, and then output for filtering and connection to an antenna (not shown). The coupler 723 provides an attenuated sample (AFC Sample) of the oscillator energy which is used to control the center frequency of the modulated oscillator 200.

Referring now to FIG. 8, the oscillator center frequency control loop may be seen. A phase locked loop 801, which in the preferred embodiment compares the automatic frequency control (AFC) sample derived from the coupler 723 (FIG. 7) to a reference frequency of 1.09375 MHz which is derived from crystal 803. The phase locked loop 801 may be a 1V80765D33 available from Motorola Inc. or its equivalent. The AFC sample, which is at the oscillator center frequency of between 1680 MHz and 2010 MHz and is processed in the preferred embodiment as follows: The AFC sample is mixed against a reference frequency generated by conventional crystal oscillator 805 in harmonic mixer 807. The harmonic mixer may be a 1V80786D99 available from Motorola Inc. or its equivalent. The mixer 807 output, which in the preferred embodiment is at a frequency of 70 MHz is passed to a conventional intermediate (IF) amplifier 809 and converted into a squared up waveform in limiter 811 (which may be MC 10115 line driver available from Motorola Inc.). The frequency sample is then converted to the requisite 1.09375 MHz signal by divide by 64 shown as 813 (which may be an MC 12017 prescaler available from Motorola Inc.). The output from phase locked loop 801, then, is a DC voltage which is applied to the modulation varactor 703 via adjustment resistor 815 and decoupling circuit 209.

The AFC is designed in the preferred embodiment to hold the modulated oscillator to the center frequency within 10 parts per million (ppm). Previous experience with dual tank impedance inverter coupled modulation circuits has indicated that the application of AFC correction voltages to the same varactor used for modulation destroys the linearity performance of the modulated oscillator by drastically changing the operating point of the varactor. Typically, AFC has been realized by loosely coupling a second varactor, not requiring linear frequency versus applied voltage performance, into the main resonator tank. Since the main frequency determining element typically has been a mechanical resonanting structure, the majority of the drift in frequency with temperature changes is determined by changes in the mechanical structure. AFC correction voltage, therefore, has been a correction of a mechanical resonator changes with temperature.

Figure 9:
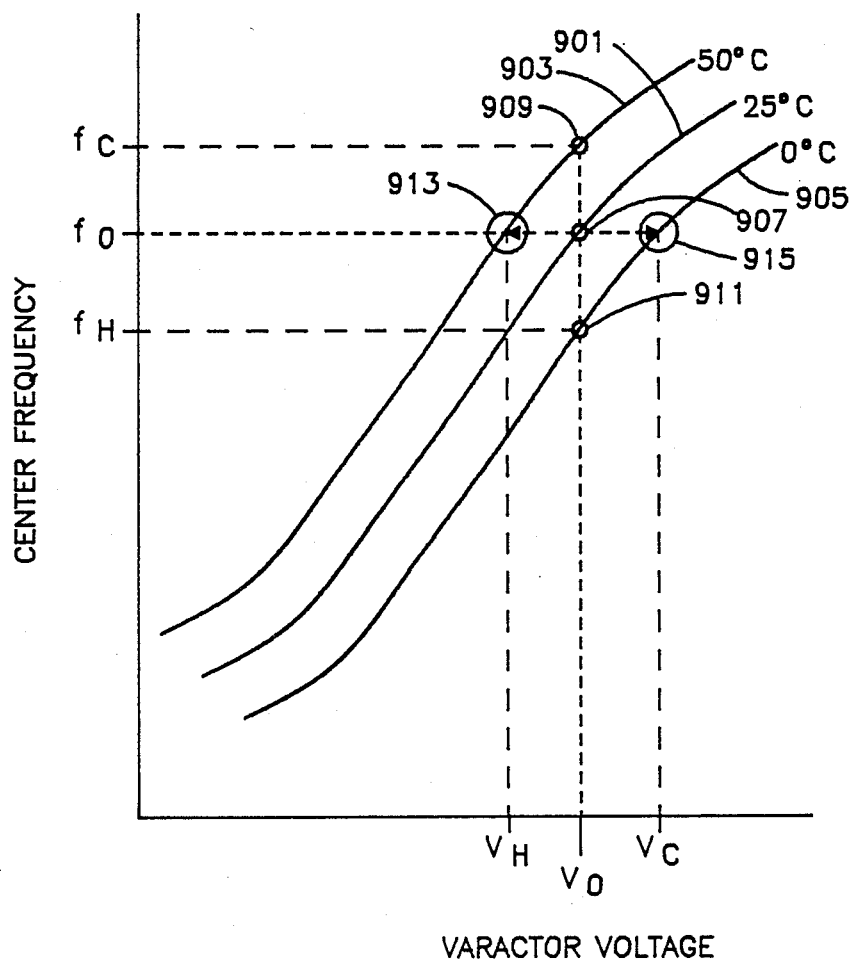
FIG. 9 is a graph of the applied voltage versus oscillator center frequency indicating the effect of temperature on a modulated oscillator employing the present invention.

In the preferred embodiment, much of the resonating electrical components are realized on a microstrip substrate. In this realization, the majority of the frequency drift with temperature is determined by the varactor diode. For this reason, compensation of the varactor diode capacitance change with frequency results in a stabilization of the center frequency of the oscillator. The oscillator center frequency versus applied varactor voltage for a typical oscillator employing the present invention is shown in FIG. 9. Room temperature performance is represented as curve 901. The shape of this frequency/voltage curve is preserved over temperature, implying that the family of curves over temperature may be represented by a shift of a constant curve shape along the horizontal voltage axis. This shift is shown by curves 903 for a temperature shift to 50° C. and curve 905 for a temperature shift to 0° C. Thus, if a nominal room temperature (25° C.) frequency is established at operating point 907, a temperature warming without an AFC will result in a change to operating point 909 and frequency shift to $f_c$. Similarly, a temperature shift in the cold direction will result in a change of operating point to 911 and a frequency change to $f_h$ if the oscillator is without an operating AFC. The AFC of the present invention preserves the frequency of the nominal operating point by shifting the applied voltage in an amount equal to the temperature coefficient of the varactor diode. Therefore, as the temperature increases, the AFC determines the amount of frequency difference between the desired frequency, $f_o$, and the actual frequency and supplies a DC voltage to the varactor equal to the drift predicted by the temperature coefficient of the varactor diode. This action is equivalent to a translation along the horizontal axis to operating point 913 for a temperature of 50° C. Similarly, a voltage translation along the horizontal axis in the opposite direction occurs for cold temperatures, such as to point 915 at 0° C. In the preferred embodiment, a phase locked loop is used to compensate the varactor diode temperature coefficient of between 600 and 900 ppm per degree centigrade. Since the varactor diode change in temperature is an equivalent horizontal shift in the voltage/frequency curve along the voltage axis, a compensating change in voltage for a change in temperature maintains the operation of the varactor diode at the same point and results in the maintanence of the modulation varactor linearity.

Since the varactor modulation diode is operated at a point where the frequency versus applied modulation voltage is always concave up or concave down, a linearizer or "predistorter" circuit is required to compensate the nonlinearities. The predistorter circuit employed in the preferred embodiment is shown in FIG. 10. The wide band signal to be modulated (baseband) is applied to a conventional baseband amplifier 1001, which may include signal preemphasis, via modulation control 1003. The output of conventional baseband amplifier 1001 is applied to a emitter follower transistor 1005 which drives two voltage dividers, 1007 and 1009. Voltage divider 1007 is a fixed linear voltage divider consisting of resistors 1011 and 1013. Voltage divider 1009 is a nonlinear divider consisting of a plurality of resistors and diodes which, in the preferred embodiment, consists of 6 diodes and 7 resistors arranged as shown. The output of voltage divider 1007 is applied to an emitter follower network consisting of transistors 1015 and 1017. Likewise, nonlinear attenuator 1009 is coupled to an emitter follower network consisting of transistors 1019 and 1021. The proportion of linear attenuation, due to voltage divider 1007, to nonlinear attenuation, due to voltage divider 1009, is selected by linearity adjustment 1023 and applied to conventional modulation buffer amplifier 1025, which may also include conventional frequency response correction elements. The output of modulation buffer amplifier 1025 is applied, along with a variable DC level which is determined by potentiometer 1027 and resistors 1029 and 1031 (which act as a coarse linearity adjustment), to the modulation varactor diode 703. This linearity adjustment may be made remotely adjustable by employing a voltage variable resistor or other variable element.

Noise performance of the modulated oscillator with a single tank and tightly coupled varacter diode must also be considered. The external loaded Q of the tank of the invention is about 4 or 5 times less than that of a conventional cavity-type oscillator tank. This lower Q (approximately 45 in preferred embodiment) was carefully determined in the design phase of the oscillator such that only a predetermined amount of sideband noise would be allowed. This careful engineering design yielded a basic intrinsic noise ratio of sideband noise of better than 61 dB at a separation of 60 KHz at 150 KHz deviation into a 3.1 KHz noise bandwidth. This is well within the limits dictated by domestic and international baseband signal to noise standards. Furthermore, the relatively low Q of the oscillator tank yielded an improved harmonic response performance of the oscillator.

Thus, a single resonant tank linearly-modulated planar microwave oscillator has been shown and described. This oscillator employs a tightly coupled varactor diode to both modulate the oscillator and introduce automatic frequency control to maintain the oscillator's center frequency. Since the modulation diode has a predetermined capacitance versus input voltage characteristic, a predistortion network is employed to compensate the nonlinearities of this capacitance/voltage performance and yields a linear frequency versus modulation voltage characteristic for the oscillator and the radio system. Therefore, while a particular embodiment of the invention has been described and shown, it should be understood that the invention is not limited thereto since many modifications may be made by those skilled in the art. It is therefore contemplated to cover by the present application any and all such modifications that fall within the true spirit and scope of the basic underlining principles disclosed and claimed herein.

I claim:

1. An angle modulatable oscillator for generating radio frequencies angle modulated with an applied modulation signal, comprising:

an active device disposed in a circuit arrangement of associated capacitive and inductive impedance components whereby oscillation at a center frequency occurs;

a signal variable impedance means forming a significant impedance component in said circuit arrangement, adjusted to a predetermined operating point and producing a nonlinear change over a band of frequencies about said center frequency with the applied modulation signal;

a modulation predistorter means coupled to said signal-variable impedance means for compensating said nonlinear change so as to effect a predetermined change simultaneously over said band of frequencies about said center frequency with the applied modulation signal; and a frequency controller means, generating a frequency correction signal applied to said signal variable impedance means to maintain said operating point and correct temperature induced impedance changes in said signal-variable impedance means, thereby maintaining said oscillator center frequency and said predetermined change essentially constant over temperature.

2. An angle modulatable oscillator in accordance with claim 1 wherein said signal-variable impedance means is a varactor diode.

3. An angle modulatable oscillator in accordance with claim 1 wherein said modulation predistorter means further comprises a linear attenuator and a nonlinear attenuator having outputs which are combined in predetermined proportion to compensate said nonlinear change about said center frequency.

4. An angle modulatable oscillator in accordance with claim 1 wherein said frequency controller means is a crystal controlled phase locked loop.

5. An angle modulatable oscillator in accordance with claim 1 wherein said predetermined change about said center frequency with said applied modulation signal comprises a mathematic relationship having the second derivative equal to a constant and negligible higher order derivatives.

6. An angle modulatable oscillator in accordance with claim 5, wherein said second derivative constant is equal to zero.

7. An angle modulatable oscillator in accordance with claim 1 wherein said frequency correction signal compensates said signal variable impedance means to predetermined limits for changes in reactance due to temperature.

8. A method for angle modulating a modulated oscillator for radio frequencies which includes an active device disposed in a circuit of reactance components such that oscillation occurs, comprising the steps of:

adjusting a variable reactance means comprising a significant portion of the circuit of reactive components to a predetermined operating point;

applying a modulation signal to said adjusted variable reactance means to produce a nonlinear change over a band of frequencies about said center frequency;

compensating said nonlinear change about said center frequency with a modulation signal predistorter thereby creating a predetermined change simultaneously over said band of frequencies about said center frequency;

determining the amount of frequency drift between said center frequency and a desired frequency of oscillation;

generating a correction signal from said determined frequency drift which maintains said predetermined operating point of said variable reactance means; and applying said correction signal to said variable reactance means, thereby maintaining both said oscillator center frequency and said predetermined change essentially constant over temperature.

9. An angle modulatable voltage controlled oscillator for radio frequencies comprising:

a semiconductor active device having input and output terminals disposed in a negative resistance oscillator employing a series arrangement of at least one transmission line and a variable capacitive impedance coupled to the input terminal of said semiconductor active element and a feedback capacitive impedance coupled between the output terminal of said semiconductor device and the input terminal of said semiconductor whereby oscillation at a center frequency occurs;

a varactor diode comprising a significant portion of said variable capacitive impedance, coupled to a modulation signal source, and adjusted to a predetermined operating point to produce a nonlinear change over a band of frequencies about said center frequency with a signal from said modulation signal source;

a modulation predistorter coupled to said varactor diode for compensating said nonlinear change over said band of frequencies about said center frequency into a linear change simultaneously over said band of frequencies about said center frequency by combining the outputs of a linear attenuator and a nonlinear attenuator in predetermined proportions; and a frequency control loop generating a frequency correction signal applied to said varactor for specifically correcting changes in the capacitance of said varactor induced by changes in temperature and maintaining said predetermined varactor operating point thereby holding the center frequency and said linear change essentially constant over temperature.

* * * * *